United States Patent
Spivey et al.

[11] Patent Number: 5,998,794
[45] Date of Patent: Dec. 7, 1999

[54] PREVENTION OF PHOTOELECTRIC CONVERSION LAYER CONTAMINATION IN AN IMAGING DEVICE

[75] Inventors: Brett Spivey, Encinitas; Paul Johnson, El Cajon; Lee Morsell, Del Mar; Peter Martin, La Jolla, all of Calif.

[73] Assignee: Thermotrex Corporation, San Diego, Calif.

[21] Appl. No.: 08/947,380

[22] Filed: Oct. 8, 1997

[51] Int. Cl.⁶ .................................................. G01T 1/24
[52] U.S. Cl. ........................... 250/370.09; 250/370.14; 257/444
[58] Field of Search .................... 250/370.09, 370.01, 250/370.12, 370.14; 257/222, 291, 443, 444, 448, 428, 466

[56] References Cited

U.S. PATENT DOCUMENTS

| | | | |
|---|---|---|---|
| 4,559,552 | 12/1985 | Yamazaki | 357/58 |
| 4,889,565 | 12/1989 | Fan et al. | 257/448 |
| 4,923,524 | 5/1990 | Kiss | 257/428 |
| 5,235,195 | 8/1993 | Tran et al. | 257/448 |

*Primary Examiner*—Edward P. Westin
*Assistant Examiner*—Richard Hanig
*Attorney, Agent, or Firm*—Fish & Richardson P.C.

[57] ABSTRACT

A semiconductor imaging device comprising MOS or CMOS pixel circuits having pixel pads separated by insulating material and having a conductive migration blocking layer applied over the pixel pads. The conductive migration blocking layer comprises an electrically conductive material that is inert with respect to selected photoelectric conversion layer materials, and may be formed as individual contacts, or formed as a deposited layer and etched to form distinct pixels covering the underlying pixel pad material. Thereafter, a photoelectric conversion layer is applied over the migration blocking layer material. The basic device is completed by applying a field electrode layer over the photoelectric conversion layer.

7 Claims, 3 Drawing Sheets

PREVENTION OF PHOTOELECTRIC CONVERSION LAYER CONTAMINATION IN AN IMAGING DEVICE

TECHNICAL FIELD

This invention relates to electronic imaging devices, and more particularly to metaloxide-semiconductor imaging devices utilizing a photoelectric conversion layer.

BACKGROUND

A number of technologies have been used for solid state imaging devices, including charged coupled device (CCD) arrays and photoconductor on thin film transistor arrays. More recently, use of metal-oxide-semiconductor (MOS) arrays (particularly complimentary metal-oxide-semiconductor (CMOS) arrays) have been used in conjunction with a photoelectric conversion layer to provide a random-access imaging device having a number of beneficial qualities. Further background information concerning such devices may be found in U.S. Pat. No. 5,528,043, entitled "X-ray Image Sensor", and assigned to the assignee of the present invention, the contents of which are hereby incorporated by reference.

FIG. 1 is a stylized diagram of a prior art MOS imaging array. Such structures are conventionally fabricated on a silicon substrate 10, on which MOS or CMOS circuitry 12 of various types is fabricated using conventional techniques. Distinct pixel circuits 14 each defining a picture element are included as part of the circuitry 12. As is known in the art, a contact of each pixel circuit 14 is in electrical contact with a conductive pixel pad 16. For compatibility with conventional processing techniques, the preferred material for the pixel pad 16 is aluminum or an aluminum alloy. Pixel pads 16 are separated from one another by insulating material 18, which may be, for example, $SiO_2$ or $Si_3N_4$.

In a conventional design, a photoelectric conversion layer 20 is overlaid on top of the pixel pads 16. An electrode layer 22 is then formed on top of the photoelectric conversion layer 20. For most applications, the electrode layer 22 is formed of a thin transparent conductive oxide (TCO) material such as indium tin oxide.

In operation, an electric field is applied between the electrode layer 22 and the pixel pads 16. Photons passing through the electrode layer 22 interact with the photoelectric conversion layer 20 and generate electron-hole pairs. Because of the applied electric field, each electron is drawn towards a nearby pixel pad 16. Differences between the amount of charge induced on the pixel pads 16 create differences in the output of the pixel circuits 14, and can be read out as an image, in known fashion.

A problem with the configuration shown in FIG. 1 is that the materials that can be used for the photoelectric conversion layer 20 are limited to those materials that do not adversely interact with the material of the pixel pads 16. Since the pixel pads 16 are typically made principally of aluminum, the material comprising the photoelectric conversion layer 20 and the process for forming or depositing the photoelectric conversion layer 20 must be compatible with aluminum. In practice, this limitation restricts the ability to use materials for the photoelectric conversion layer 20 that must be formed at temperatures in excess of about 200° C.; otherwise, adverse reactions due to direct chemical contamination or "poisoning" of the aluminum or of the photoelectric conversion layer material may occur.

The inventors have determined that it would be useful in a MOS or CMOS imaging array to be able to use a much wider variety of photoelectric conversion materials having desirable characteristics at different wavelengths of incident light, from infrared to x-ray. Accordingly, the inventors have determined that there is a need to prevent contamination of the photoelectric conversion layer material by migration of aluminum contact material within such an imaging device. The present invention overcomes the problems of the prior art.

SUMMARY

The invention includes a semiconductor imaging device comprising MOS or CMOS pixel circuits having pixel pads separated by insulating material and having a conductive migration blocking layer applied over the pixel pads. The conductive migration blocking layer may be formed as individual contacts, or formed as a deposited layer and etched to form distinct pixels covering the underlying pixel pad material. The blocking material may be of a metal such as molybdenum, or a doped semiconductor material such as indium-tin oxide or boron or phosphorous doped silicon. Thereafter, a photoelectric conversion layer is applied over the migration blocking layer material. The basic device is completed by applying a field electrode layer over the photoelectric conversion layer.

In another aspect, the invention includes a solid state radiation detection unit for producing pixel data from electron-hole producing radiation, the solid state radiation detection unit including: (1) a plurality of metal oxide semiconductor pixel circuits each defining a pixel and including a pixel electrode for collecting charge indicative of pixel data; (2) migration protection material forming a migration blocking layer covering each pixel electrode and comprising an electrically conductive material that is inert with respect to selected photoelectric conversion materials; (3) a radiation absorbing layer deposited on the array of pixel circuits and comprising an electrically insulating photoelectric conversion material that generates charge on exposure to selected wavelengths of electron-hole producing radiation; (4) a field electrode formed on or within the radiation absorbing layer and comprising an electrically conducting material, the field electrode being connectable to a voltage source for establishing an electric field between the field electrode and the pixel electrodes, wherein charge generated in the radiation absorbing layer is collected by the pixel electrodes under the influence of the electric field.

In one embodiment of the invention, a doped junction layer may be interposed between the photoelectric conversion layer and the electrode layer to provide a diode structure. The invention also includes a method of forming an imaging device having the structure described above.

Advantages of the invention include:

prevention of migration and other forms of contamination between the photoelectric conversion layer and the pixel pad material, which permits use of a wider range of photoelectric conversion materials in a MOS or CMOS based imaging device;

ability to use high temperature deposition techniques for the photoelectric conversion layer, which permits use of a wider range of photoelectric conversion materials in a MOS or CMOS based imaging device;

use of smaller pixel pads more easily conforming to minimum separation rules of a MOS or CMOS manufacturing process, while allowing larger effective pixel areas due to the overlying migration blocking layer pixel pads.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Figure 1:
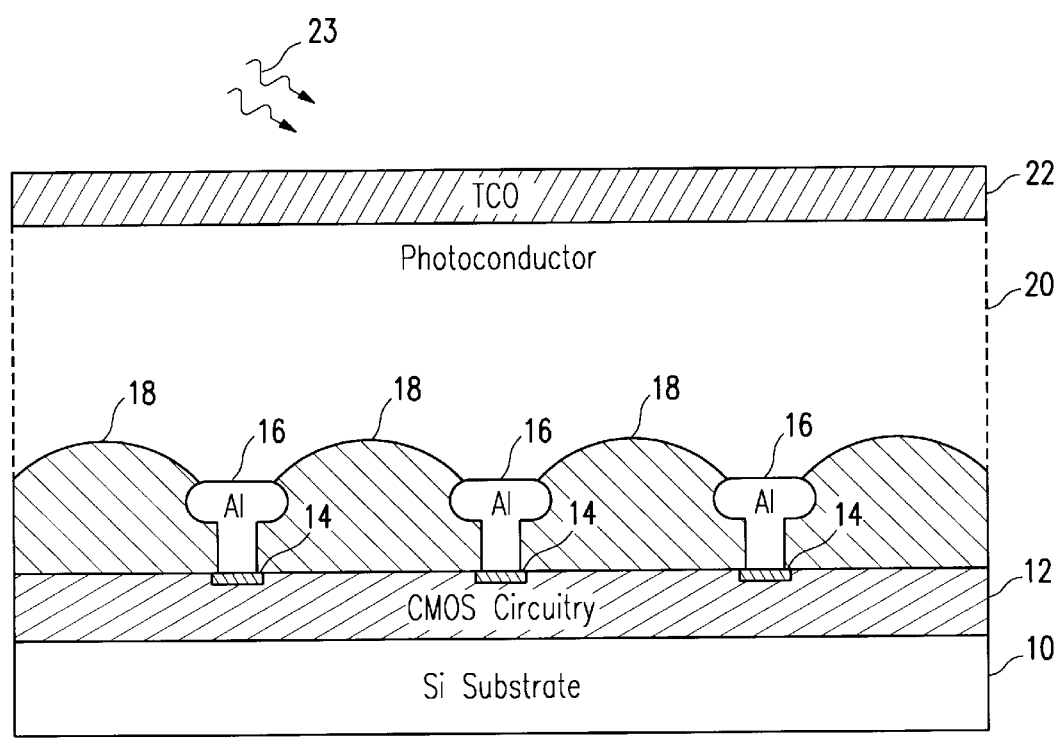
FIG. 1 is a stylized diagram of a prior art MOS imaging array.
Figure 2:
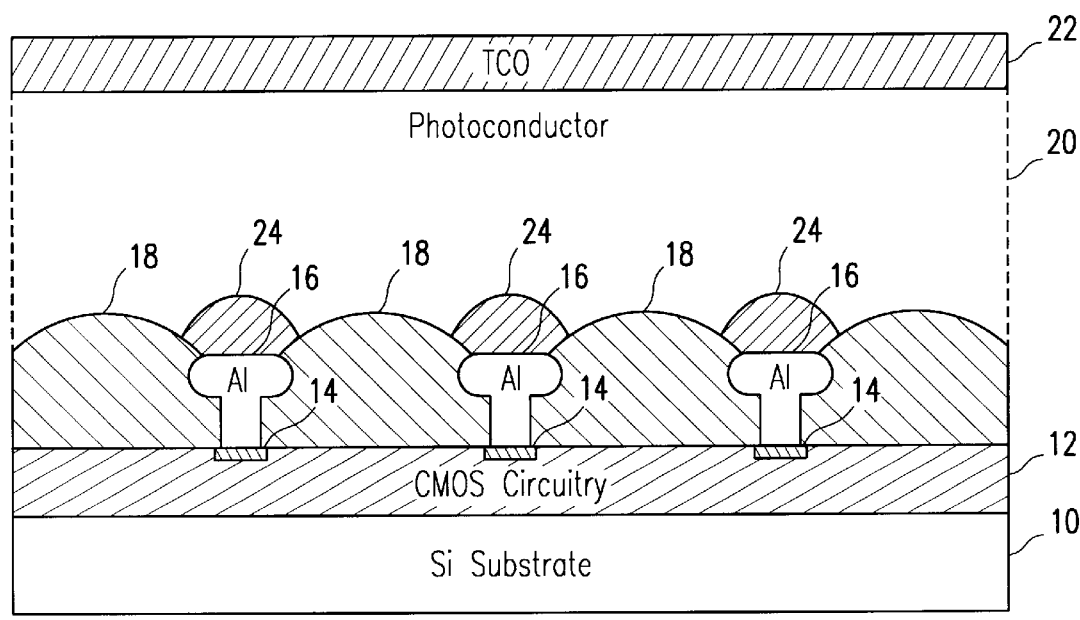
FIG. 2 is a stylized diagram of a MOS imaging array in accordance with the present invention.

FIG. 2 is a stylized diagram of a MOS imaging array in accordance with the present invention. The imaging array is designed to be used as a solid state radiation detection unit to capture images at different wavelengths of incident light, from infrared to x-ray depending on the type of photoconductor used. MOS or CMOS circuitry 12 of various types are fabricated using conventional techniques on a substrate 10, typically comprising silicon. Distinct pixel circuits 14 each defining a picture element (pixel) are included as part of the circuitry 12. In particular, each pixel circuit 14 comprises a charge measuring transistor circuit for measuring charge collected by a pixel electrode and selectively outputting a signal indicative of pixel data. An example of a suitable charge measuring transistor circuit is described in U.S. Pat. No. 5,528,043, entitled "X-ray Image Sensor", and assigned to the assignee of the present invention, the contents of which are hereby incorporated by reference.

As is known in the art, a contact of each pixel circuit 14 is in electrical contact with a conductive pixel pad 16. Each pixel pad 16 comprises an electrode for collecting charge indicative of pixel data. For compatibility with conventional processing techniques, the preferred material for the pixel pad 16 is aluminum or an aluminum alloy. However, the inventive concepts can be used with any pixel pad material that is subject to contamination or migration. Pixel pads 16 are separated from one another by insulating material 18, which may be, for example, $SiO_2$ or $Si_3N_4$.

Next, an electrically conducting migration blocking layer 24 is applied over the pixel pads. Application may be, for example, by electroplating, or by coating followed by lithography. Coating may be by sputtering, evaporation, chemical vapor deposition, batch precipitation, etc. The conductive migration blocking layer 24 may be formed as individual contacts through a masking medium, or formed as a deposited layer and pattern etched to form distinct pixels covering the underlying pixel pads. The migration blocking layer material may be of a metal such as molybdenum, or a doped semiconductor material, such as indium-tin oxide or boron or phosphorous doped silicon, and must be essentially inert with respect to the photoelectric conversion materials selected for the next step.

Thereafter, a photoelectric conversion layer 20 is applied over the migration blocking layer material, typically by sputtering, evaporation, chemical vapor deposition, batch precipitation, etc. More particularly, the photoelectric conversion layer 20 is an electrically insulating photoelectric conversion material that generates charge on exposure to selected wavelengths of electron-hole producing radiation. Suitable materials depend on wavelength to be imaged and desired processing techniques. A partial list of candidates for the photoelectric conversion material are set forth in U.S. Pat. No. 5,352,897 to Horikawa et al., which is hereby incorporated by reference. Because of the presence and function of the migration blocking layer 24, higher deposition temperatures may be used for the photoelectric conversion layer 20, which permits use of a wider range of photoelectric conversion materials in a MOS or CMOS based imaging device.

The basic device is completed by applying a electrically conducting field electrode layer 22 over the photoelectric conversion layer 20, in known fashion. For most applications, the electrode layer 22 is formed of a thin transparent conductive oxide (TCO) material such as indium tin oxide (a material with semiconductor properties). Other materials suitable for the electrode layer 22 include very thin metal layers such as gold or platinum, or any of the conducting polymers such as polyaniline. A heavily doped semiconductor layer might also serve as the electrode layer 22 if made sufficiently conductive.

The electrode layer 20 must be at least partially transparent to the desired wavelengths of electron-hole producing radiation to be imaged. The electrode layer 22 may be formed on or within (e.g., by ion implantation) the photoelectric conversion layer 20. In an alternative embodiment, a doped junction layer may be interposed between the photoelectric conversion layer 20 and the electrode layer 22 to provide a diode structure in order to reduce dark current within the device.

In operation, an electric field is typically applied between the electrode layer 22 and the pixel pads 16 covered by corresponding migration blocking layer 24 material, thereby establishing an electric field between the electrode layer 22 and the pixel electrodes 16. The electric field can be generated from an applied external voltage source, or by coupling the field electrode to ground. Photons passing through the electrode layer 22 interact with the photoelectric conversion layer 20 and generate electron-hole pairs. Because of the applied electric field, each electron is drawn towards a nearby pixel pad 16. Differences between the amount of charge induced on the pixel pads 16 create differences in the output of the pixel circuits 14, and can be read out as an image, in known fashion.

Figure 3:
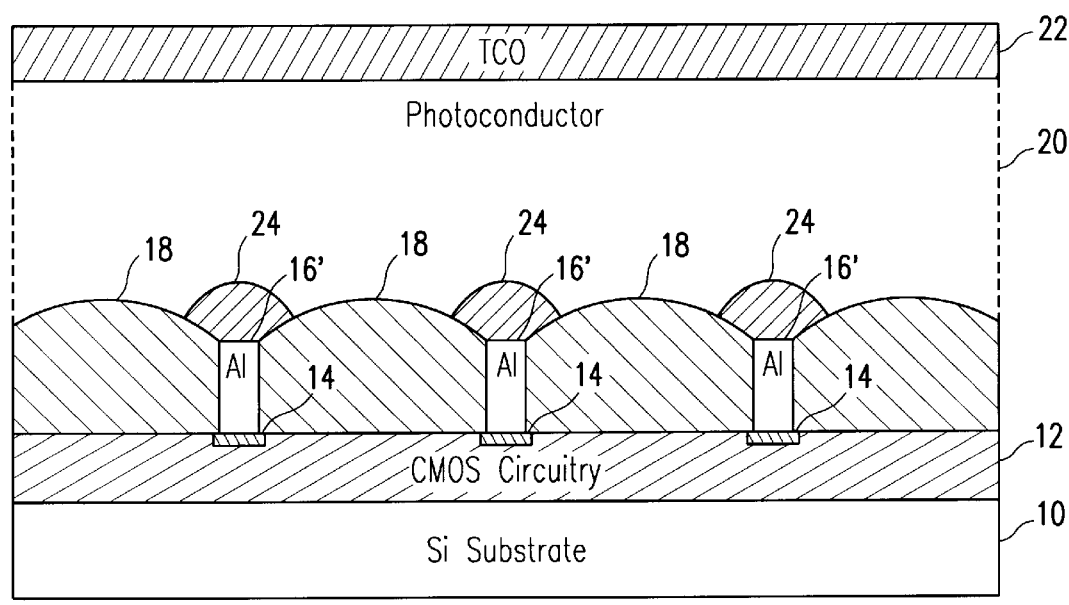
FIG. 3 is a stylized diagram of a MOS imaging array in accordance with an alternative embodiment of the present invention.

FIG. 3 is a stylized diagram of a MOS imaging array in accordance with an alternative embodiment of the present invention. In this embodiment the size of the pixel pads 16' is reduced compared to the size of the pixel pads 16 shown in FIG. 2. The conductive migration blocking layer 24 material provides a large collection area for each corresponding underlying pixel pad 16'.

A number of embodiments of the present invention have been described. Nevertheless, it will be understood that various modifications may be made without departing from the spirit and scope of the invention. For example, although the preferred embodiment of the invention is an imaging sensor, the concepts of the invention can be applied to non-imaging radiation detection units. Accordingly, other embodiments are within the scope of the following claims.

What is claimed is:

1. A solid state radiation detection unit for producing pixel data from electron-hole producing radiation, including:
   (a) a plurality of metal oxide semiconductor pixel circuits each defining a pixel and including a pixel electrode for collecting charge indicative of pixel data;
   (b) migration protection material forming a migration blocking layer covering each pixel electrode and comprising an electrically conductive material that is inert with respect to selected photoelectric conversion materials;

(c) a photoelectric conversion layer deposited on the array of pixel circuits that generates charge on exposure to selected wavelengths of electron-hole producing radiation;

(d) a field electrode formed in contact with the photoelectric conversion layer and comprising an electrically conducting material, the field electrode being connectable to a voltage source for establishing an electric field between the field electrode and the pixel electrodes, wherein charge generated in the photoelectric conversion layer is collected by the pixel electrodes under the influence of the electric field.

2. A solid state radiation detection unit for producing pixel data from electron-hole producing radiation, including:

(a) a substrate comprising a semiconductor material;

(b) a plurality of metal oxide semiconductor pixel circuits incorporated into and on the substrate to form an array of pixel circuits, each of the semiconductor pixel circuits defining a pixel and including:

(1) a pixel electrode for collecting charge indicative of pixel data;

(2) a migration protection layer deposited on the pixel electrode, comprising an electrically conductive material that is inert with respect to selected photoconductor materials;

(c) a radiation absorbing layer covering the array of pixel circuits and comprising an electrically insulating photoelectric conversion material that generates charge on exposure to selected wavelengths of electron-hole producing radiation;

(d) a surface electrode formed on the radiation absorbing layer and comprising an electrically conducting material, the electrode layer being at least partially transparent to such selected wavelengths of electron-hole producing radiation, and connectable to a voltage source for establishing an electric field across the radiation absorbing layer to the pixel electrodes.

3. The solid state radiation detection unit of claims 1 or 2, wherein each pixel circuit further includes a charge measuring transistor circuit for measuring charge collected by the pixel electrode and selectively outputting a signal indicative of pixel data.

4. In a solid state radiation detection pixel array including a plurality of metal oxide semiconductor pixel circuits each defining a pixel including a pixel electrode for collecting charge indicative of pixel data, and a photoelectric conversion layer deposited on the array of pixel circuits that generates charge on exposure to selected wavelengths of electron-hole producing radiation, the improvement comprising:

migration protection material forming a migration blocking layer covering each pixel electrode and comprising an electrically conductive material that is inert with respect to the photoelectric conversion layer.

5. A method of manufacturing a solid state radiation detection unit for producing pixel data from electron-hole producing radiation, comprising the steps of:

(a) forming a plurality of metal oxide semiconductor pixel circuits each defining a pixel and including a pixel electrode for collecting charge indicative of pixel data;

(b) depositing a migration protection material forming a migration blocking layer over each pixel electrode, the migration protection material comprising an electrically conductive material that is inert with respect to selected photoconductor materials;

(c) depositing a photoelectric conversion layer on the array of pixel circuits for generating charge on exposure to selected wavelengths of electron-hole producing radiation;

(d) forming a field electrode in contact with the photoelectric conversion layer, the field electrode comprising an electrically conducting material connectable to a voltage source for establishing an electric field between the field electrode and the pixel electrodes, wherein charge generated in the photoelectric conversion layer is collected by the pixel electrodes under the influence of the electric field.

6. A method of manufacturing a solid state radiation detection unit for producing pixel data from electron-hole producing radiation, comprising the steps of:

(a) providing a substrate comprising a semiconductor material;

(b) forming a plurality of metal oxide semiconductor pixel circuits incorporated into and on the substrate to form an array of pixel circuits, each of the semiconductor pixel circuits defining a pixel and formed by the steps of:

(1) forming a pixel electrode for collecting charge indicative of pixel data;

(2) depositing a migration protection layer on the pixel electrode, the migration protection layer comprising an electrically conductive material that is inert with respect to selected photoconductor materials;

(c) depositing a radiation absorbing layer covering the array of pixel circuits and comprising an electrically insulating photoelectric conversion material for generating charge on exposure to selected wavelengths of electron-hole producing radiation;

(d) forming a surface electrode on the radiation absorbing layer comprising an electrically conducting material, the electrode layer being at least partially transparent to such selected wavelengths of electron-hole producing radiation, and connectable to a voltage source for establishing an electric field across the radiation absorbing layer to the pixel electrodes.

7. The method of claims 5 or 6, further including the step of forming a charge measuring transistor circuit connected to each pixel circuit, further includes for measuring charge collected by the pixel electrode and selectively outputting a signal indicative of pixel data.

* * * * *